United States Patent
Dent et al.

(10) Patent No.: US 6,768,389 B2
(45) Date of Patent: Jul. 27, 2004

(54) INTEGRATED, DIGITALLY-CONTROLLED CRYSTAL OSCILLATOR

(75) Inventors: Paul W. Dent, Pittsboro, NC (US); Nikolaus Klemmer, Apex, NC (US)

(73) Assignee: Ericsson Inc., Research Triangle Park, NC (US)

( * ) Notice: Subject to any disclaimer, the term of this patent is extended or adjusted under 35 U.S.C. 154(b) by 5 days.

(21) Appl. No.: 10/252,198

(22) Filed: Sep. 23, 2002

(65) Prior Publication Data

US 2004/0056728 A1 Mar. 25, 2004

(51) Int. Cl.⁷ .................................................. H03L 1/00
(52) U.S. Cl. .................. 331/175; 331/177 R; 331/158; 331/116 R; 331/74
(58) Field of Search ................................ 331/177 R, 175, 331/116 R, 158, 74, 135, 167

(56) References Cited

U.S. PATENT DOCUMENTS

| | | | |
|---|---|---|---|
| 4,128,817 A | 12/1978 | Gomi | 331/177 R |
| 4,230,953 A | 10/1980 | Wilcox | 327/518 |
| 4,286,235 A | 8/1981 | Wilber et al. | 331/116 R |
| 4,571,558 A | 2/1986 | Gay et al. | 331/105 |
| 4,600,899 A | 7/1986 | Kennedy | 331/116 R |
| 4,733,200 A | 3/1988 | Ecklund et al. | 331/116 R |
| 4,916,412 A | 4/1990 | Nordholt et al. | 331/34 |
| 5,010,308 A | 4/1991 | Cowley | 331/116 R |
| 5,047,734 A | 9/1991 | Newell et al. | 331/46 |
| 5,136,263 A | 8/1992 | Lane | 331/158 |
| 5,352,993 A | 10/1994 | Mader | 331/107 A |
| 5,388,127 A | 2/1995 | Scarpa | 375/376 |
| 5,581,215 A | * 12/1996 | Ogasawara | 331/45 |
| 5,731,744 A | 3/1998 | Diffenderfer | 331/158 |
| 5,939,917 A | 8/1999 | Debaty | 327/246 |
| 6,072,427 A | 6/2000 | McEwan | 342/175 |

FOREIGN PATENT DOCUMENTS

| | | |
|---|---|---|
| EP | 0765031 A1 | 3/1997 |
| GB | 2 039 438 A | 8/1980 |
| JP | 9246865 | 9/1997 |

* cited by examiner

Primary Examiner—Arnold Kinkead
(74) Attorney, Agent, or Firm—Coats & Bennett, PLLC

(57) ABSTRACT

A quartz crystal oscillator comprises a balanced circuit with a quartz crystal resonator device connected in series resonance across a balanced, low-impedance node within a sustaining amplifier. A phase modulator such as a quadrature modulator is included in the feedback loop to allow programming of the loop phase shift thereby to alter the frequency point on the crystal resonance curve at which the circuit oscillates. The in-phase loop signal is hardlimited while the quadrature loop signal component is not hardlimited with the effect that the frequency control curve slope is more accurately defined. An active neutralization of the crystal's parasitic shunt capacitance is disclosed for obtaining a linear frequency control curve.

33 Claims, 18 Drawing Sheets

IDEALIZED EQUIVALENT CIRCUIT OF A
PARALLEL RESONANT CRYSTAL OSCILLATOR $$\begin{pmatrix} V1 \\ I1 \end{pmatrix} = \begin{pmatrix} 1 & 0 \\ sC_1 & 1 \end{pmatrix} \begin{pmatrix} 1 & Z \\ 0 & 1 \end{pmatrix} \begin{pmatrix} 1 & 0 \\ sC_2 & 1 \end{pmatrix} \begin{pmatrix} V2 \\ I2 \end{pmatrix}$$

SINCE $I2=0$, $I1 = s(C_1 + C_2) + s^2 C_1 C_2 Z$ $$= -W^2 C_1 C_2 R + jW(C_1 + C_2)\left[1 - W\frac{C_1 C_2}{C_1+C_2} X\right]$$

$$= -W^2 C_1 C_2 R \quad \text{WHEN} \quad W\frac{C_1 C_2}{C_1+C_2} X = 1$$

VARIOUS CIRCUITS FOR THE INVENTION USING A SERIES RESONANT CRYSTAL, SHOWING WHERE A VARIABLE PHASE SHIFTER $\phi$ CAN BE PLACED

FLAT FREQUENCY RESPONSE CIRCUIT

CIRCUIT USING TWO INTEGRATORS

VARIOUS CIRCUITS FOR THE INVENTION USING A SERIES RESONANT CRYSTAL, SHOWING WHERE A VARIABLE PHASE SHIFTER φ CAN BE PLACED

CIRCUIT USING TWO DIFFERENTIATORS

USE OF COMPOUND TRANSISTORS FOR INPUT STAGE

INTEGRATED, DIGITALLY-CONTROLLED CRYSTAL OSCILLATOR

BACKGROUND OF THE INVENTION

The present invention relates generally to the field of variable crystal oscillators and specifically to a variable crystal oscillator suitable for inclusion on an integrated circuit.

Radio frequency mobile communications terminals, such as for example cellular telephones, require an on-board frequency reference for establishing operating channel frequencies. The mobile terminal receives a base station signal and measures the apparent frequency error of the received signal. Since the base stations use highly accurate frequency sources, any error in a received signal is attributed to the mobile terminal's own frequency reference. Mobile terminals typically utilize crystal oscillator circuits whose frequency is electronically adjustable. Such circuits are known as Voltage Controlled Xtal Oscillators (VCXO). The mobile terminal, upon detecting an apparent frequency error in a received signal, generates a frequency correction signal and adjusts the crystal oscillator to reduce the apparent frequency error. The mobile terminal's reference oscillator accuracy is thereby adjusted to equal that of the base station by automatic frequency correction (AFC). It is well known in the prior art that the mobile terminal may compute the frequency error digitally, the digital error value then being applied to a digital to analog (D/A) converter to generate a correcting voltage to the VCXO.

Prior art VCXOs are constructed by connecting a quartz crystal resonator in the feedback loop of a sustaining amplifier. A variable-capacitance diode (Varicap or Varactor diode) is associated to the crystal circuit to allow frequency adjustment by applying a voltage to the varactor diode to change its capacitance, and thereby to change the resonant frequency of the circuit formed by the crystal plus the varactor diode.

Great strides have been made in reducing the cost of cellular phones by integrating electrical and logical circuits and functions into silicon or Gallium Arsenide integrated circuits, or chips. However, components such as varactor diodes used in a prior art VCXOs are difficult to integrate, as they require different semiconductor processing steps than the rest of an integrated circuit.

It is known in the art to vary the frequency of a crystal oscillator by varying a phase shift with the feedback loop, rather than using a varactor diode. Furthermore, it is known to produce the varying phase shift by varying the magnitude of a quadrature signal component. However, prior art VCXOs utilizing this approach have various deficiencies. Some do not operate the crystal oscillator in series resonant mode. Others implement control circuits with the undesirable characteristic that the loop gain is dependent on the quadrature signal component that is varied to alter the oscillator's frequency. This is problematic, particularly when the VCXO must be controlled over a wide frequency range. Furthermore, if the crystal is connected in a relatively high impedance circuit, the Q-factor at series resonance is reduced, thereby degrading the stability and phase noise of the oscillator and rendering it unsuitable for applications in which the crystal frequency must be multiplied up to several GHz, as in modern mobile terminals.

Another known problem with prior art varactor-less VCXOs is that the linearity of the frequency control curve is adversely affected by the crystal's parasitic shunt capacitance. Some prior art solutions compensate for the crystal parasitic capacitance by employing a variable inductor to linearize the control curve. However, such a component is not suitable for integration.

Still other prior art VCXOs maintain a constant gain under varying quadrature signal components that alter the output frequency, but exhibit a control curve slope that is inversely proportional to the equivalent resistance of the crystal, which is an ill-defined parameter, rendering reliable control difficult.

When integrating the crystal oscillator function with other functions in a few chips to reduce cost, care must be taken to avoid mutual interference between functions, which can occur as signals go in and out of pins on the chip, relative to a common ground. Therefore balanced, or differential, circuits are preferred for reducing unwanted coupling, as is known in the art. Moreover, the crystal in a mobile terminal must be operated at a high Q-factor to obtain low phase noise after multiplying the frequency to the 2 GHz range.

SUMMARY OF THE INVENTION

A quartz crystal oscillator comprises a balanced circuit with a quartz crystal resonator device connected in series resonance across a balanced, low-impedance node within a sustaining amplifier. A phase modulator such as a quadrature modulator is included in the feedback loop to allow programming of the loop phase shift thereby to alter the frequency point on the crystal resonance curve at which the circuit oscillates. The in-phase loop signal is hardlimited while the quadrature loop signal component is not hardlimited with the effect that the frequency control curve slope is more accurately defined. An active neutralization of the crystal's parasitic shunt capacitance is disclosed for obtaining a linear frequency control curve.

DETAILED DESCRIPTION OF THE INVENTION

Figure 1:
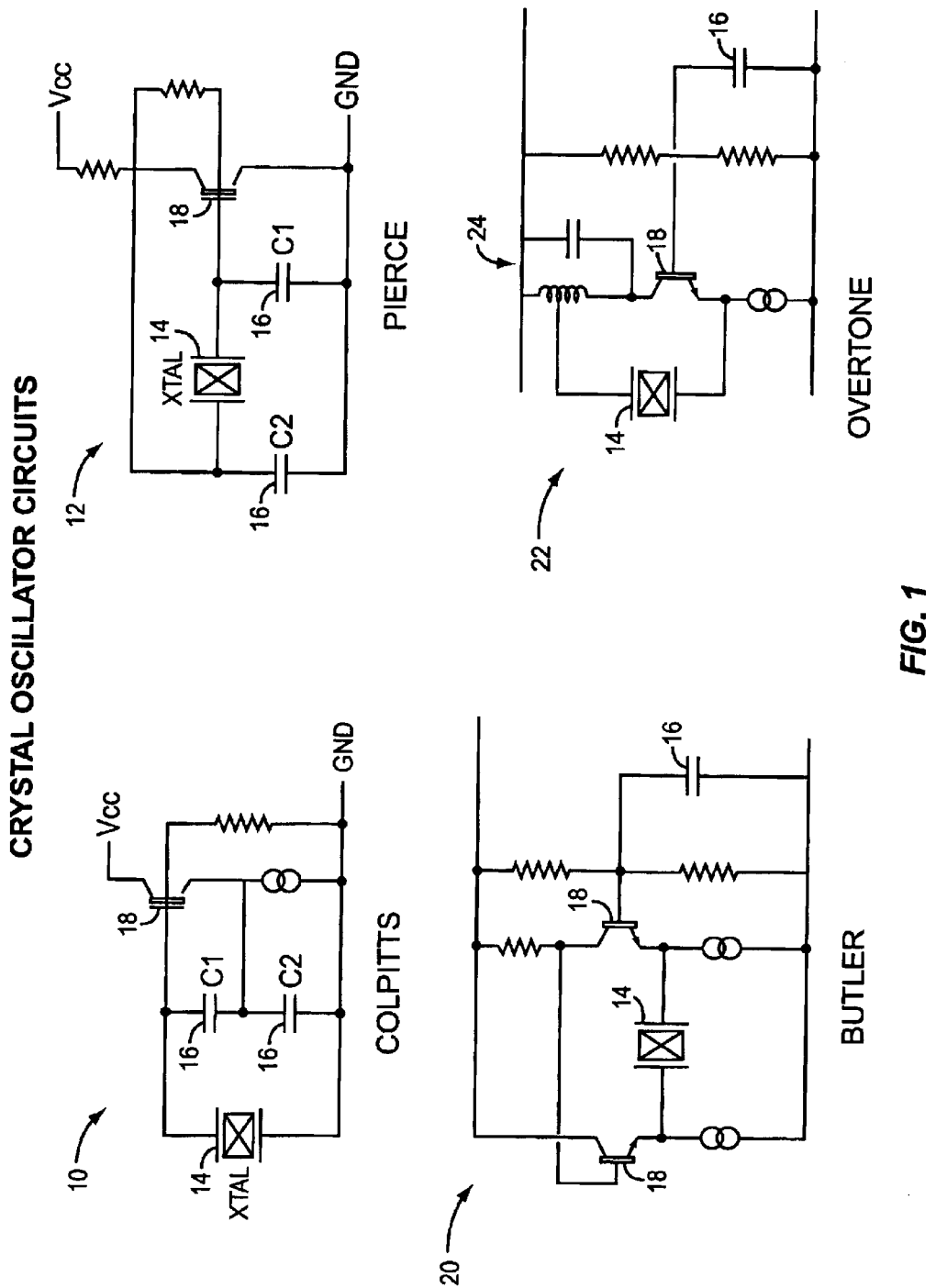
FIG. 1 depicts a variety of prior art crystal oscillator circuits.

FIG. 1 shows various prior art crystal oscillator circuits. The Colpitts oscillator 10 and the Pierce oscillator 12 differ only in which point of the circuit is grounded, and how bias is applied to the active device. They both use the crystal 14 in a parallel resonant (high-impedance) mode forming a π-circuit with the crystal 14 as the series element and capacitors 16 as the shunt elements. The circuit oscillates at the frequency where the π-circuit has a 180-degree phase shift, where the crystal impedance is inductive between its series-resonant frequency and its parallel self-resonant frequency. Since the parallel-resonant crystal oscillator circuits are high-impedance, the sustaining amplifier needs to have a high input and output impedance, ideally infinite input impedance (or a pure capacitance that can be regarded as part of C1) and a current source output. These characteristics were fulfilled by vacuum tubes, and are substantially fulfilled by the more modern Field Effect Transistor (FET) 18.

The Butler oscillator 20 uses the crystal 14 in series resonant (low impedance) mode, as does the overtone oscillator 22. The circuits 20, 22 oscillate at the frequency where the crystal impedance becomes low and resistive, and the amplifier in this case has zero phase shift, modulo-$2\pi$. The overtone oscillator 22 can employ an LC tuned circuit 24 to select operation around an overtone or harmonic of the crystal's fundamental frequency.

All the circuits of FIG. 1 can be categorized as either using the crystal 14 in a parallel resonant mode or in a series resonant mode. In the parallel resonant mode, the crystal 14 usually acts like the inductor in a resection with shunt capacitors 16 to create a 180-degree phase shift at resonance. The sustaining amplifier is then a phase inverting amplifier to produce a loop phase shift of zero, modulo-$2\pi$.

In the series resonant mode, the crystal 14 resonates to a low impedance and is connected in such a way as to maximize the loop gain at series resonance. The sustaining amplifier in that case usually has zero loop phase shift. Because the crystal 14 is used in its low-impedance resonance mode, the amplifier should have low input and output impedances; ideally zero input impedance and a voltage source output.

A VCXO is usually constructed with the crystal 14 used in parallel resonance, with one or both of the capacitors 16 being a varactor diode, there being no such components to vary in the case of the series-resonance oscillators. However, in the present invention, series resonance is a preferred implementation and novel means are disclosed to vary the frequency of oscillation according to a well-defined control characteristic curve.

Figure 2:
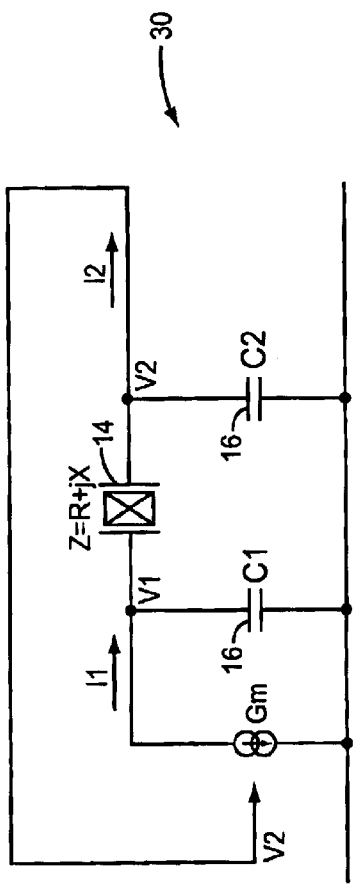
FIG. 2 is an idealized equivalent circuit of a parallel resonant crystal oscillator.

FIG. 2 shows the idealized circuit of a crystal oscillator 30 using the crystal 14 in parallel resonance. It is shown in FIG. 2 that the necessary condition for oscillation occurs when the crystal reactance X resonates with the series combination of $C_1$ and $C_2$, i.e., when $$X = \frac{1}{wC_1} + \frac{1}{wC_2} \quad (1)$$

The transconductance $G_m$ of the amplifier must then be at least equal to $w^2C_1C_2R$ to sustain oscillation.

The minimum gain requirement is with $C_1=C_2=C_0$, and a variable frequency crystal oscillator (VXO) is produced by varying $C_0$. Since the crystal reactance X is a function of frequency X(w), equation (1) is a transcendental equation for the frequency w as a function of $C_0$. It is simpler to choose w and calculate $C_0$ and thus plot $C_0$ versus w, as shown in FIG. 3.

Figure 3:
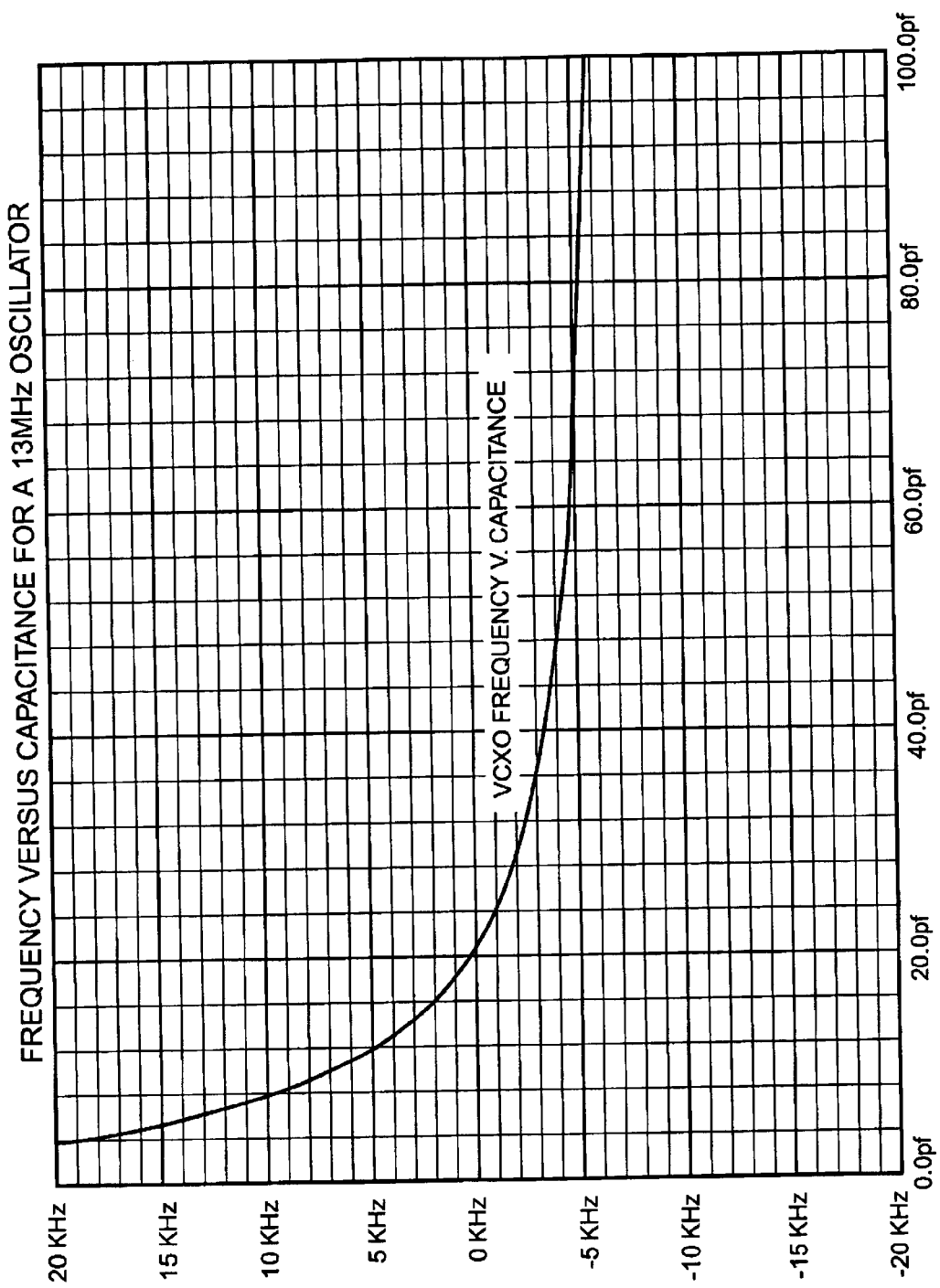
FIG. 3 is a plot of frequency vs. capacitance for the circuit of FIG. 3A.
Figure 3A:
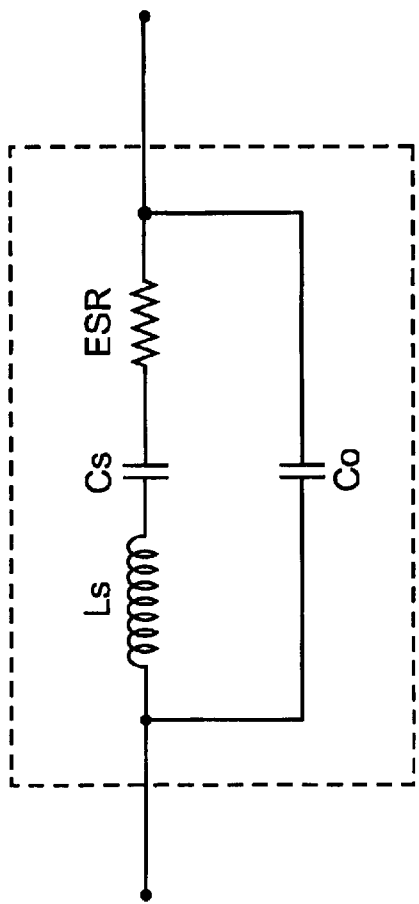
FIG. 3A is a crystal equivalent circuit.

The curve of FIG. 3 was calculated using the crystal equivalent circuit parameters shown in FIG. 3A. With the parameters of FIG. 3A and the range of tuning capacitance from 4 pF to 100 pF, FIG. 3 illustrates that a range of frequency adjustment of +20 KHz to −6 KHz can be achieved. The type of VCXO exemplified by FIG. 3 is not ideal for the several reasons.

If a large tuning range is indeed required, the frequency versus control parameter range is very non-linear. On the other hand, if it is only required adjust the frequency to compensate for crystal tolerance and temperature effects, which together may total only ±10 ppm (±130 Hz), then the VCXO sensitivity of 30 ppm per picofarad around the nominal frequency is too sensitive to the tuning capacitor tolerance.

Figure 4:
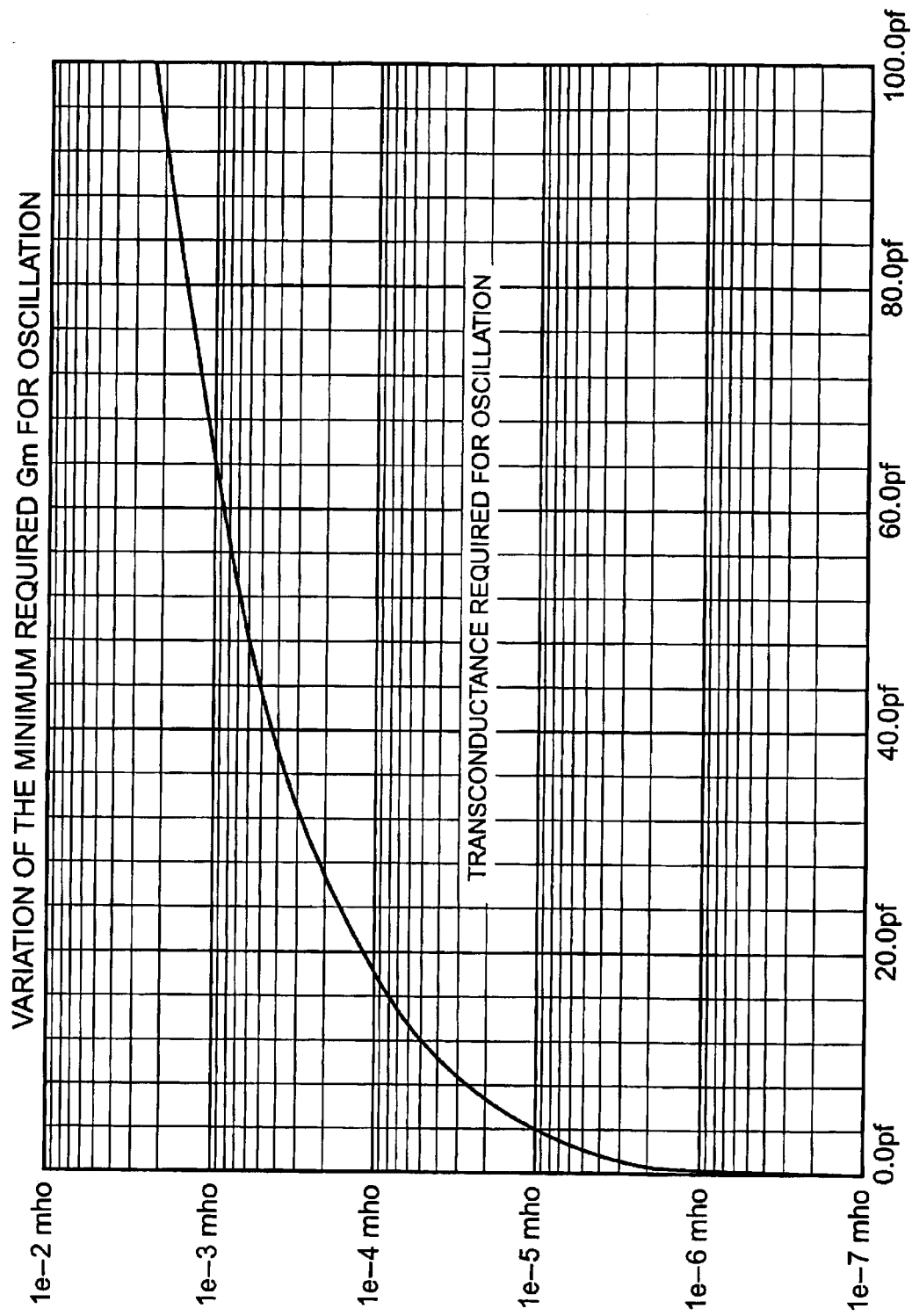
FIG. 4 is a plot of the minimum transconductance $G_m$ vs. capacitance.

In addition, the transconductance gain of the amplifier needed to sustain oscillation varies over a wide range, as shown in FIG. 4.

To solve the above problems with the prior art parallel resonant VCXOs, the present invention uses the crystal in series resonant mode with a variable phase shifter to adjust the frequency. Various circuits for series-resonant crystal oscillators are shown in FIG. 5, which also suggests suitable places within the loop that such a phase shifter may be located. Some aspects of these circuits are known from the prior art.

Figure 5A:
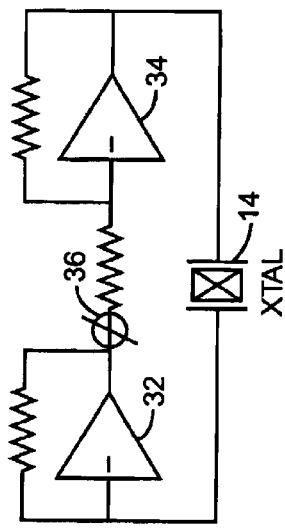
FIGS. 5A, 5B, and 5D are various circuits employing a variable phase shifter to alter the output frequency of a crystal oscillator circuit.

FIG. 5A illustrates a circuit using operational amplifier notation, in which the amplifier has a flat frequency response. The operational amplifier 32 has a virtual ground input, i.e., a very low input impedance. The operational amplifier 32 effectively causes the AC crystal current also to flow through its feedback resistor 33, generating an AC output voltage proportional to the crystal current, but phase inverted. The operational amplifier 34 is merely a phase-inverting amplifier to provide the non-inverting overall gain required for oscillation, and has a low output impedance for driving the crystal in series resonant mode. A variable phase shifter for adjusting operating frequency may be located between operational amplifiers 32 and 34.

In FIG. 5A, assuming the crystal 14 is a series LCR resonator and ignoring for the moment its shunt capacitance $C_0$ of typically 2.8 pF, the crystal impedance would be a minimum at series resonance and equal to the equivalent series resistance (ESR) of exemplary 8.7 Ω. When the frequency is adjusted to either side of series resonance, the crystal impedance is of the form R+jX(w) where X is a reactive part that is a function of frequency w and R is a constant equal to the ESR when $C_0$ is ignored. The loop gain and the AC crystal current would then be reduced in proportion to 1/(R+jX(w)). In order to maintain required loop phase shift of zero, the phase shifter would need to cause a phase shift of $\phi=\tan^{-1}(X/R)$ and the loop gain would need to be increased in magnitude by the factor $\sqrt{R^2+X^2}$.

A quadrature modulator may be used to control both gain and phase shift of a signal. A quadrature modulator comprises a first balanced modulator to vary the amount of output signal that is in phase with the input signal to the quadrature modulator (i.e., the real part r) and a second balanced modulator to vary the amount of output signal that is in quadrature with the input signal (i.e., the imaginary part i). The quadrature component that is varied by the second balanced modulator may be created by passing the input signal through a fixed 90-degree phase shift network.

Both the phase and the gain variation required may thus be achieved by controlling only the quadrature part of the gain $G_I$ of the total gain $G_r+jG_I$ such that $$\frac{G_r + j G_i}{R + j X}$$

is always real, i.e., $$\frac{G_i}{X} = \frac{G_r}{R}$$

The in-phase gain $G_r$, with $G_I$ zero, is set to be sufficient for the circuit to oscillate with the crystal operating at its series resonant frequency, where its impedance is real and nominally a minimum. $G_r$ thus represents a minimum gain. Varying $G_I$ in either direction from zero will then cause the frequency w to change so that the crystal reactance $$X(w) = \frac{G_i R}{G_r}$$

and will increase the modulus of the gain so that the loop gain is constant. Thus only half of a quadrature modulator is required—that half which modulates the quadrature or imaginary part of the loop gain $G_I$. The in-phase or real part of the loop gain $G_r$ need not be varied, at least under the assumption that the effect of $C_0$ can be neglected. The validity of this assumption may be tested by plotting the real and imaginary gain components required for oscillation versus the frequency of oscillation, using the actual crystal equivalent circuit of FIG. 3A.

Figure 6:
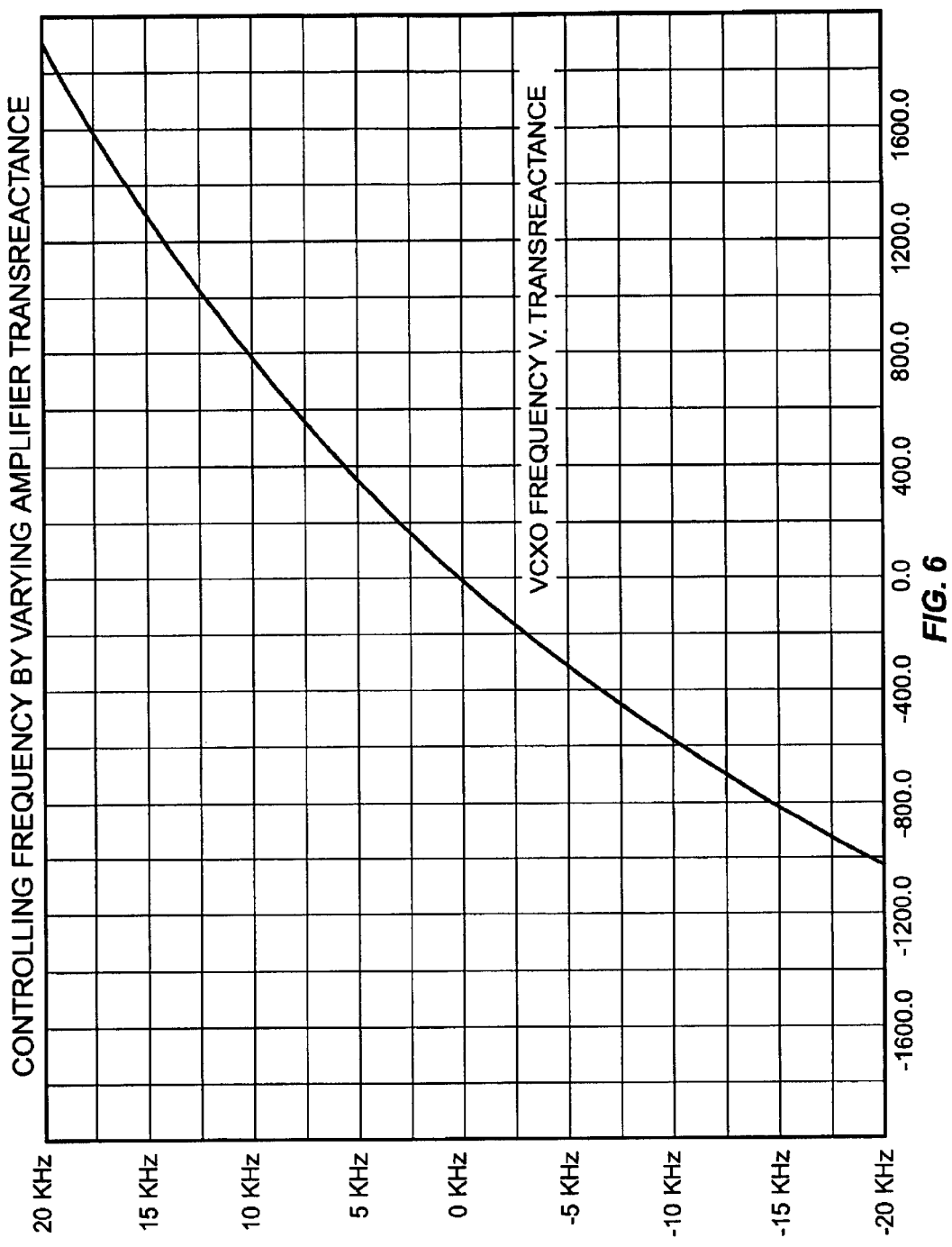
FIG. 6 is a plot of VCXO frequency vs. transreactance for the circuit of FIG. 3A.

FIG. 6 shows the frequency of oscillation versus the quadrature gain, which is the controlling parameter. The gain has the dimensions of a transimpedance, and is plotted in units of Ohms. The phase of the transimpedance is equal to $$\tan^{-1}\left(\frac{G_i}{G_r}\right);$$

since the quadrature transimpedance $G_I$ ranges over much more than the $G_r$(=ESR) of 8.7 Ω, the phase is near + or −90 degrees over much of the plotted range, and the frequency versus phase function is a very non-linear curve over a wide frequency range. On the other hand, the curve of frequency versus the quadrature part of the transimpedance is more linear, as shown in FIG. 6. This illustrates that it is preferable to control frequency by varying the quadrature part of the transimpedance of the sustaining amplifier, i.e. the transreactance, rather than to vary a phase shift, when a large frequency variation is desired.

Figure 7:
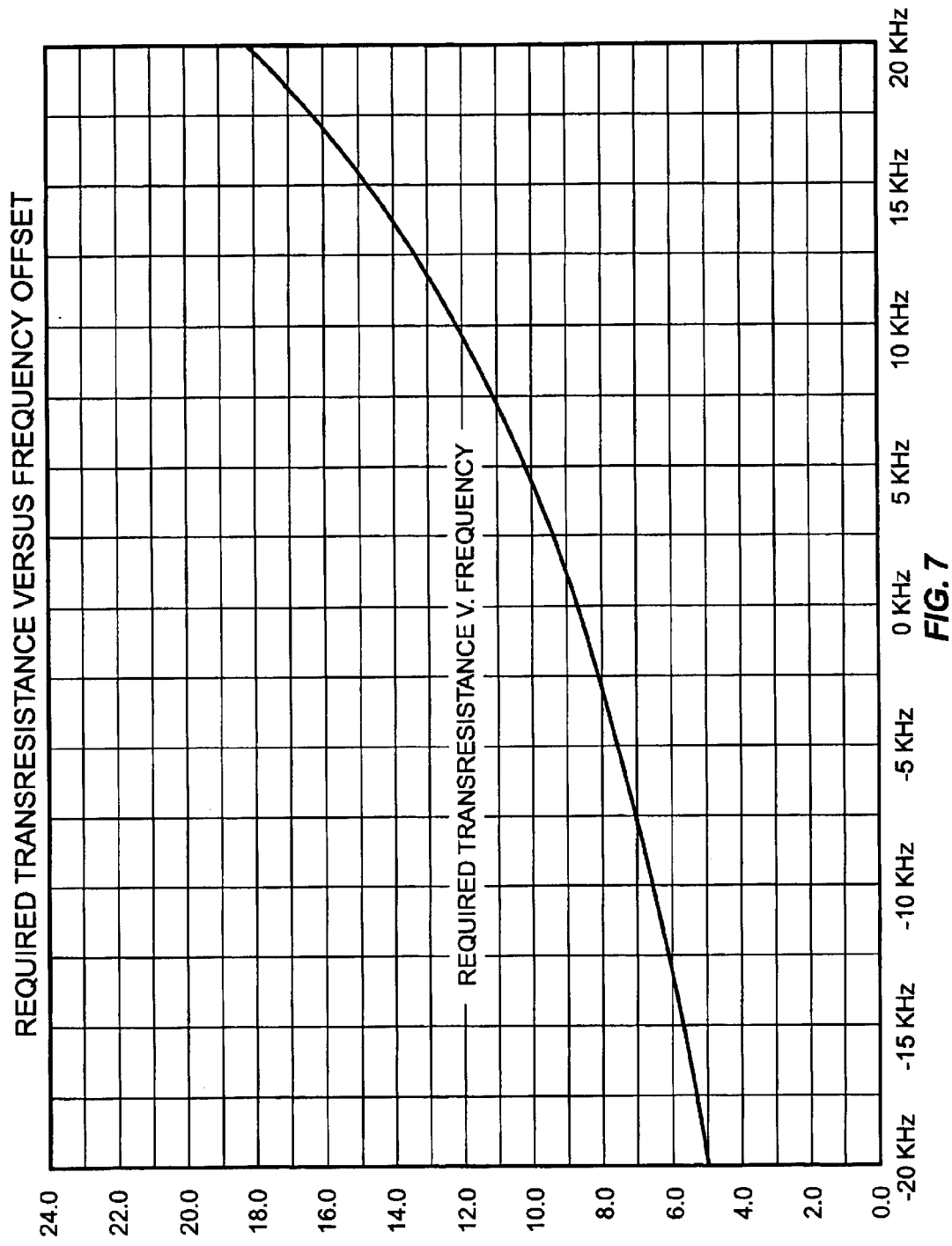
FIG. 7 is a plot of transresistance $G_r$ vs. frequency.

FIG. 7 shows the required in-phase part of the amplifier transimpedance $G_r$ to sustain oscillation, versus frequency offset. By comparing with FIG. 4 it is clear that this varies over a much smaller range for the series resonant VCXO than the transconductance required for the parallel resonant VCXO.

Figure 8:
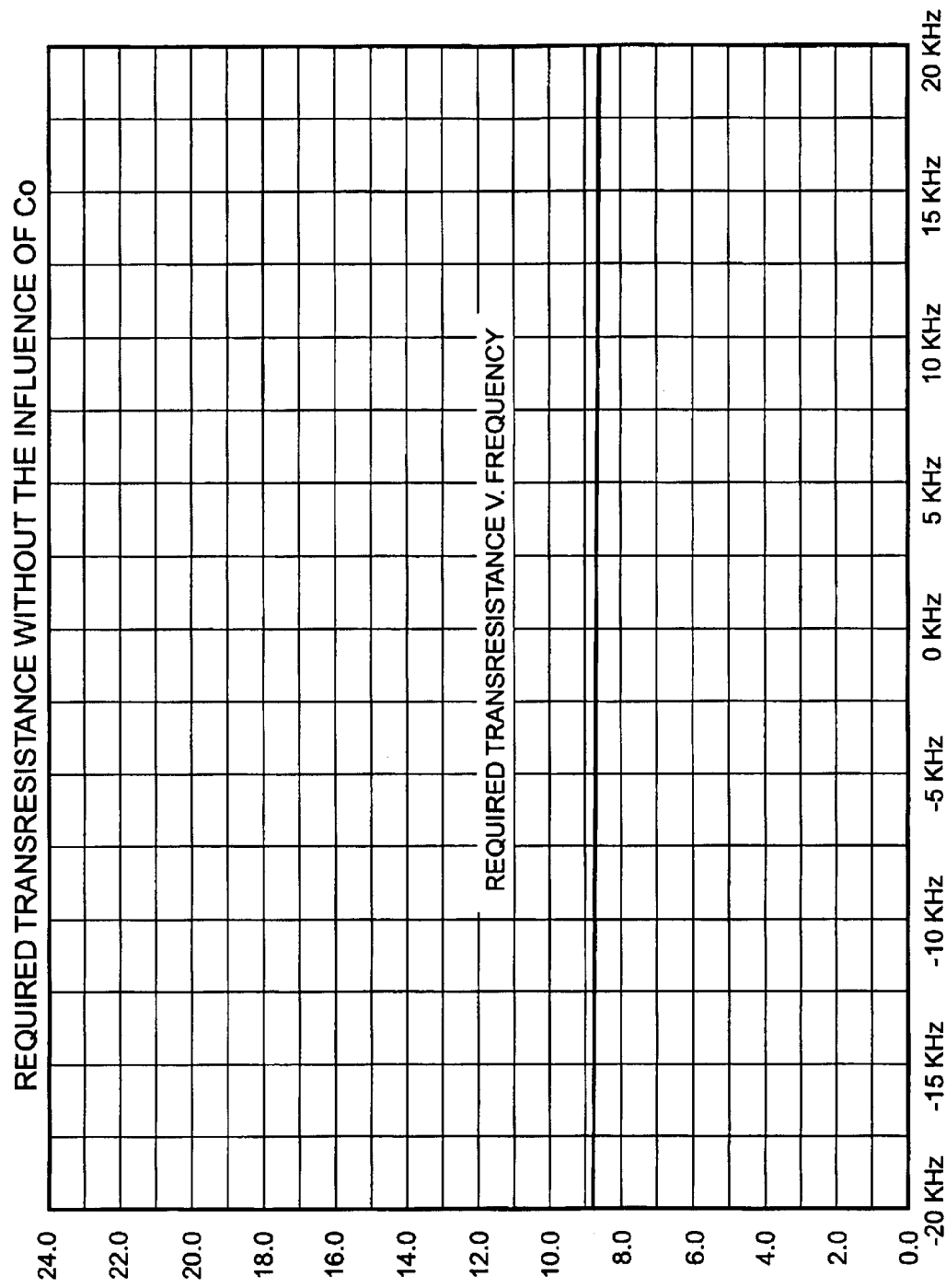
FIG. 8 is a plot of transresistance $G_r$ vs. frequency when $C_0$ is neglected.
Figure 9:
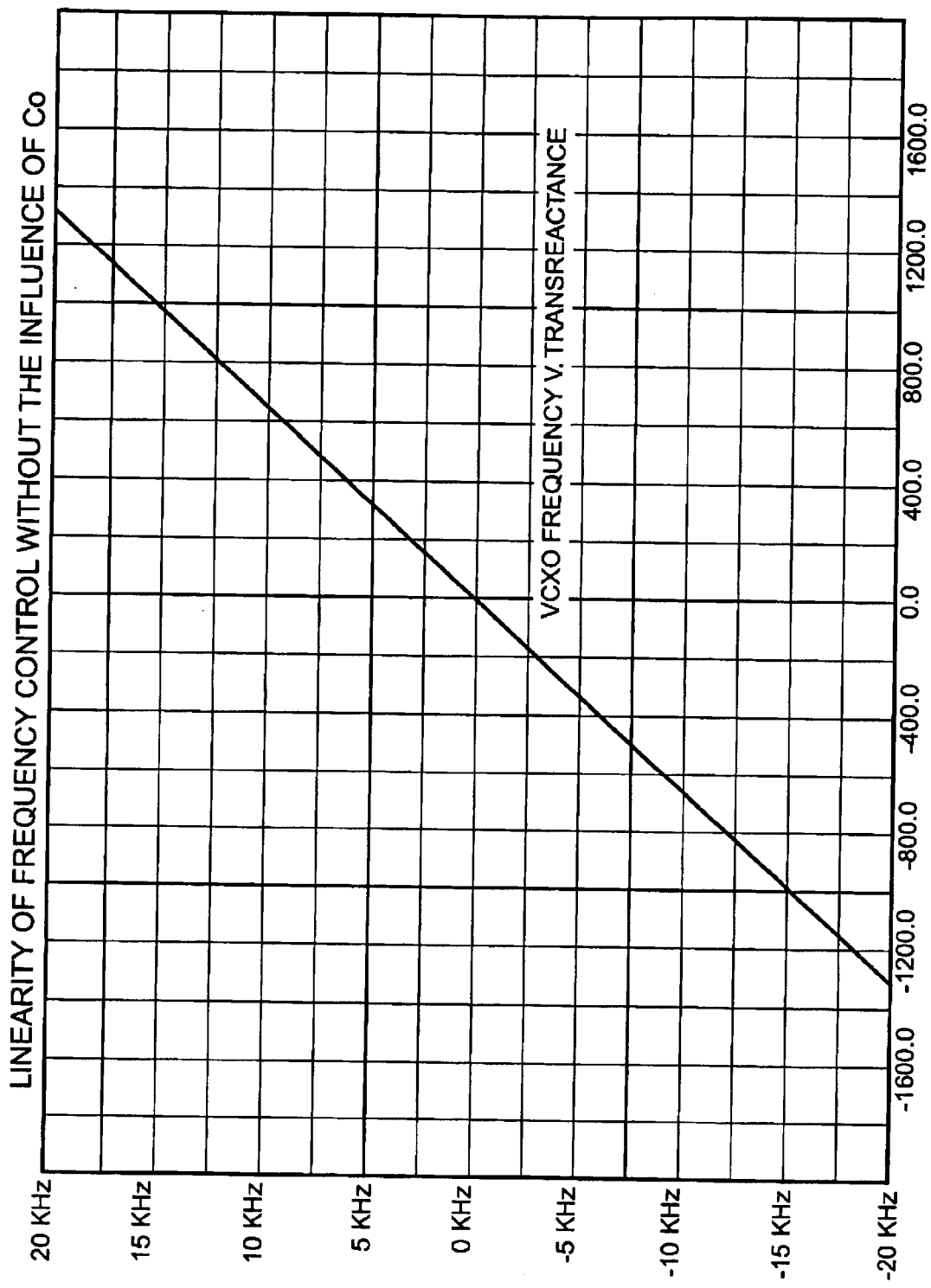
FIG. 9 is a plot of transreactance $G_i$ vs. frequency when $C_0$ is neglected.

The required transresistance would be a constant equal to the 8.7 Ω ESR were it not for the influence of the crystal shunt capacitance $C_0$ of 2.8 pF, as is shown in FIG. 8, which was computed for $C_0$=0.0. Likewise, the curve of frequency versus transreactance for $C_0$=0.0 is more linear, as shown in FIG. 9. Therefore there is a motivation to attempt to neutralize or compensate for the effect of $C_0$, as further disclosed below.

Figure 5B:
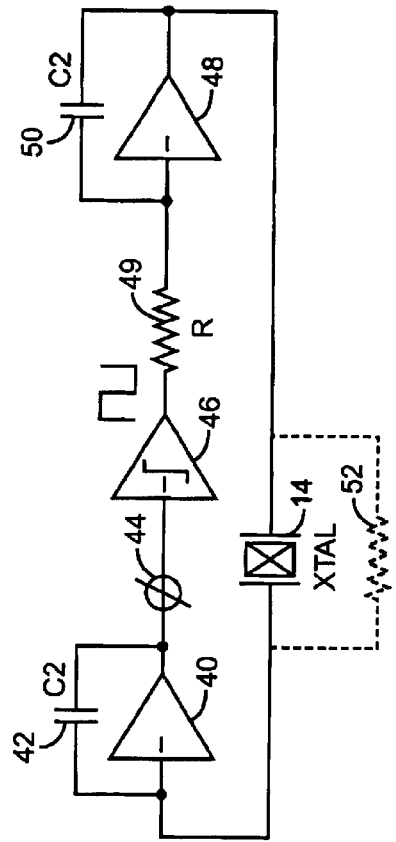

Referring to FIG. 5B, the uncertainty regarding the precise transresistance required for oscillation is handled by the use of a limiting amplifier between the two integrators. The operation of FIG. 5B is as follows: The output of limiter 46 is a square wave, which drives the integrator operational amplifier 48 using R 49 and $C_2$ 50 to form a triangular wave. Since the limiter 46 output is a constant amplitude square wave, the triangular waveform is also of constant amplitude. The triangular wave containing principally a fundamental component is then filtered by the crystal impedance that emphasizes the fundamental component relative to the harmonics, thereby allowing substantially only a fundamental sine wave current component to flow from the crystal 14. The sine wave current is then integrated by operational amplifier 40 and $C_1$ 42 to produce the sine wave at the input to phase shifter 44. The phase shifter 44 produces a phase shifted sine wave to drive the limiter 46. The limiter 46 drive voltage depends on the rather imprecisely specified ESR of the crystal, indicated as the dotted-line resistor 52, but despite variations in the input amplitude, the output of limiter 46 remains a constant amplitude signal, thus ensuring that oscillation is sustained despite variations in the crystal 14 impedance.

Figure 5C:
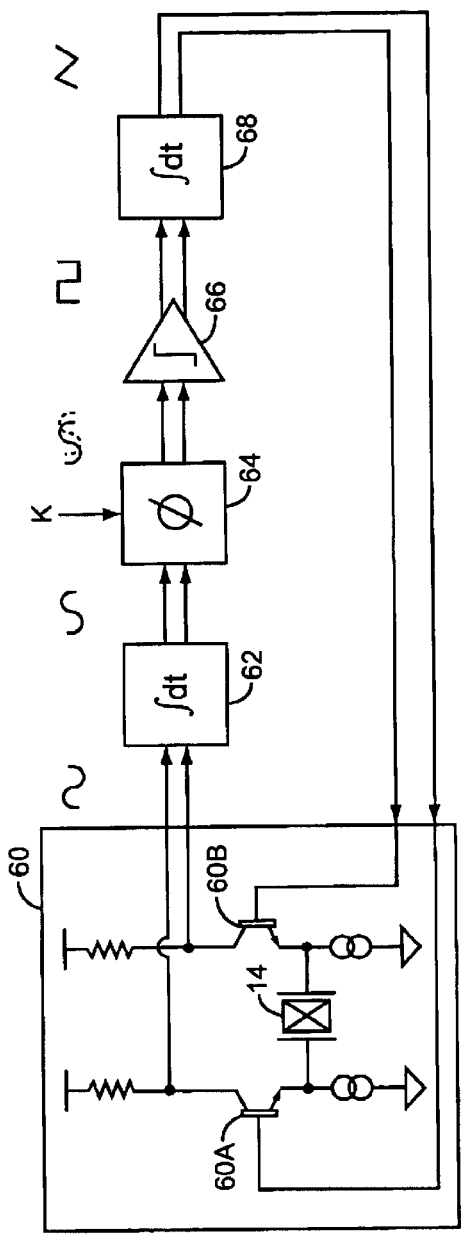
FIG. 5C is a balanced, differential version of the circuit of FIG. 5B.

An improved version of the circuit of FIG. 5B, using balanced components and a differential loop signal, is depicted in FIG. 5C. Balanced amplifier 60 includes two transistors 60A and 60B in a push-pull, or balanced, configuration. The crystal 14 is connected between the emitters of transistors 60A, 60B such that the differential pair has gain inversely proportional to the crystal impedance, and maximum gain occurs at crystal series resonance. The fully balanced circuit minimizes unwanted coupling with other circuit functions that may be integrated on to the same chip, thus providing improved noise immunity over the corresponding configuration of FIG. 5B. The differential output signal passes through a first balanced integrator 62, and then through a phase shifter 64 (with a control input K that controls the degree of phase shift induced). The differential output of the phase shifter 64 feeds a balanced hard limiter 66, which generates a square wave that preserves the phase information, but the which is of a signal amplitude substantially independent of its input signal amplitude. The balanced limiter 66 thus imposes a constant loop gain on the in-line component of the feedback signal, while preserving the phase shifter 64 alteration of the quadrature gain. The differential output of the balanced limiter 66 feeds a second balanced integrator 68, which generates a triangular waveform, which is filtered by the crystal 14 to emphasize its fundamental frequency component, generating a sine wave output of the balanced amplifier 60. This operation is substantially similar to that described above with reference to FIG. 5B, with the addition of balanced components and a differential feedback signal to reduce coupling and improve noise and crosstalk immunity. Note that the balanced integrators 62, 68 each contribute 90-degrees of phase shift, and the balanced limiter 66 contributes 180-degrees of phase shift, for a nominal loop phase shift of 360 degrees, or zero phase shift, as required for oscillation.

Figure 5D:
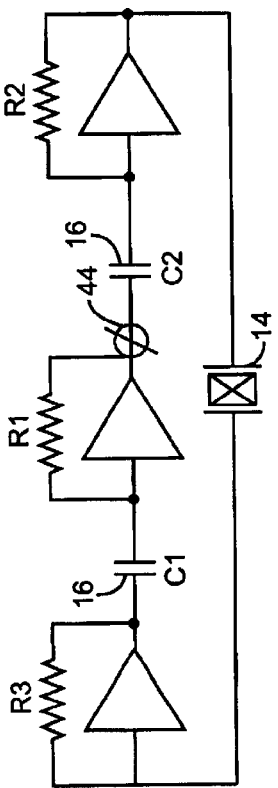

FIG. 5D depicts the use of differentiators to produce the phase shift required for oscillation, with the phase shifter 44 altering the oscillator output frequency. The operation of FIG. 5D is essentially the same as FIG. 5B except that the differentiators produce phase advances of 90 degrees instead of the phase lags of 90 degrees produced by integrators. However, differentiators also produce higher gain at overtone frequencies than at the fundamental, whereas integrators produce lower gain at overtones than at the fundamental. Therefore integrators are preferred when overtone suppression is desired. The integrators may be leaky integrators to compensate for incidental additional phase lags in practical circuits, and to prevent drift of the DC operating point.

In both the circuits of FIG. 5B and FIG. 5C, the required phase shift to produce a given frequency shift is $$\tan^{-1}\left(\frac{R_i}{R_r}\right),$$

where $R_r + jR_i$ is the crystal complex impedance. Thus the slope of frequency versus phase depends on $G_r$. If the phase shifter 44 or 64 comprises a constant in-phase gain $G_r$ and a controlled quadrature gain $G_i$, then $$G_i = \left(\frac{G_r}{R_r}\right)R_i$$

shows that the quadrature gain to produce a given $R_i$ and therefore frequency offset also depends on the ESR, $R_r$. To avoid the frequency control sensitivity depending on the ill-specified ESR, there is therefore a motivation for devising additional circuit improvements that will make the control sensitivity largely independent of the ESR. In the prior art, this may have been inadvertently achieved by diluting the crystal ESR with a large external resistance. However, this lowers the Q of operation, which raises undesired phase noise levels substantially.

Figure 10A:
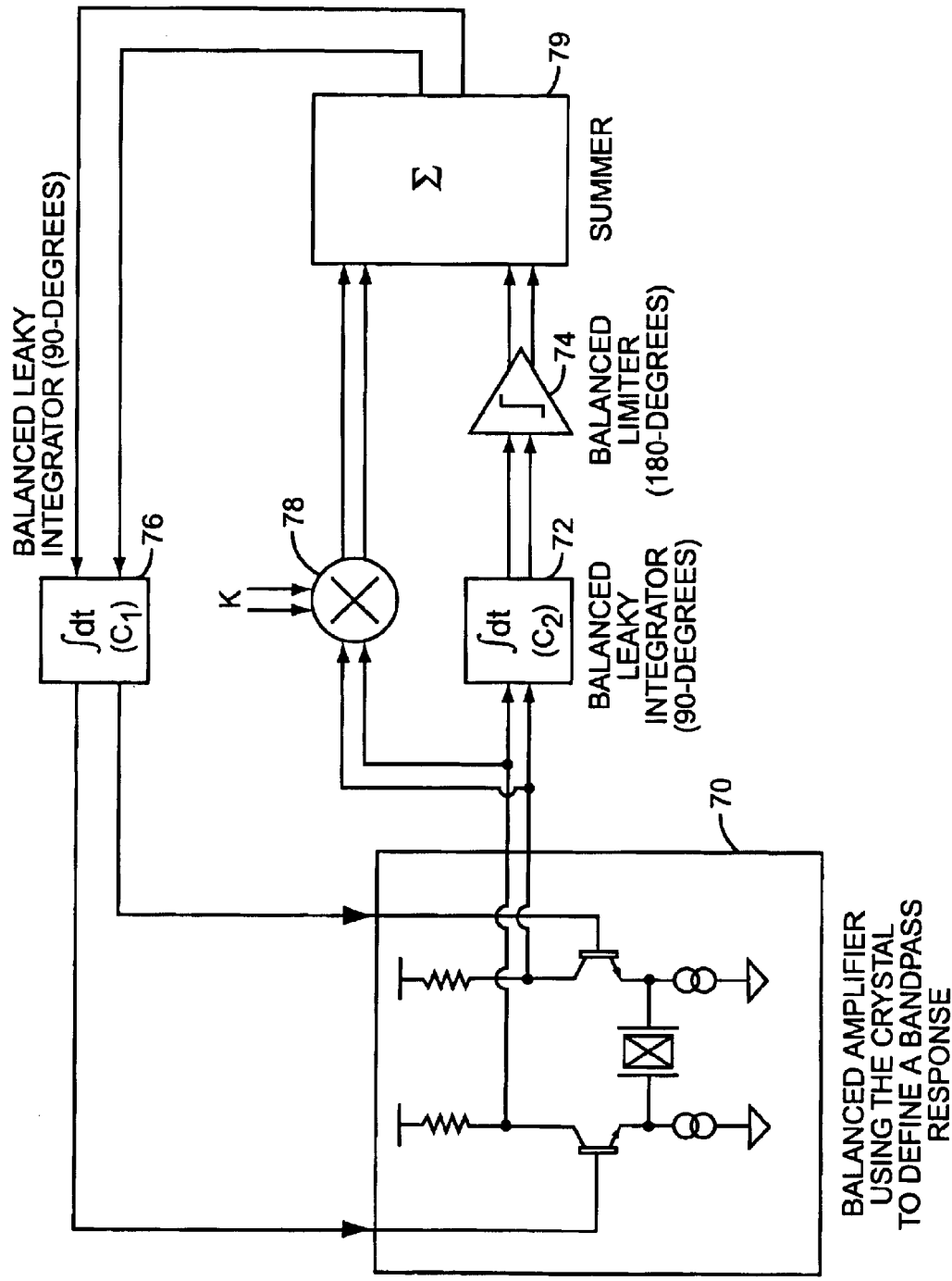
FIG. 10A is a block diagram of a VXO circuit.

FIG. 10A depicts a block diagram of one embodiment of a variable crystal oscillator (VXO) according to the present invention, in which the slope of the frequency control curve is substantially independent of the crystal ESR. This is accomplished by defining two feedback loops. One includes a limiter that fixes the real gain at a constant and provides a zero loop phase shift, modulo 360-degrees, to produce oscillation. The other loop is not modulated, and includes a balanced modulator to vary the quadrature gain and thus alter the oscillator frequency. The two feedback loops differ by 90-degrees in phase shift.

Referring to FIG. 10A, balanced amplifier 70 includes the crystal 14 in series resonant mode, connected to low impedance emitters of a balanced (push/pull) transistor amplifier. The differential output of balanced amplifier 70 travels in a first feedback loop to balanced integrator 72, balanced limiter 74, and balanced integrator 76. The integrators 72, 76 each contribute a 90-degree phase shift, and the limiter 74 contributes a 180-degree phase shift, for a loop gain of 360, or zero phase shift, to support oscillation. The gain $G_r$ of the first loop is constant due to the limiter 74 removing any loop amplitude variation of the differential feedback signal.

The circuit of FIG. 10A includes a second feedback loop, wherein the differential outputs of balanced amplifier 70 are connected to a balanced modulator 78. Modulator 78 is operative to alter the gain $G_r$ of the second loop in response to differential control input K. The second loop differential signal then joins the first loop signal at summing junction 79, and passes through the second balanced integrator 76. The second loop phase shift is 90 degrees (induced by integrator 76), and is thus 90 degrees out of phase with the first loop signal. Variations in the non-limited second loop signal are thus in quadrature to the first loop signal; in this manner the modulator 78 may be controlled to alter the oscillator output frequency.

Figure 10B:
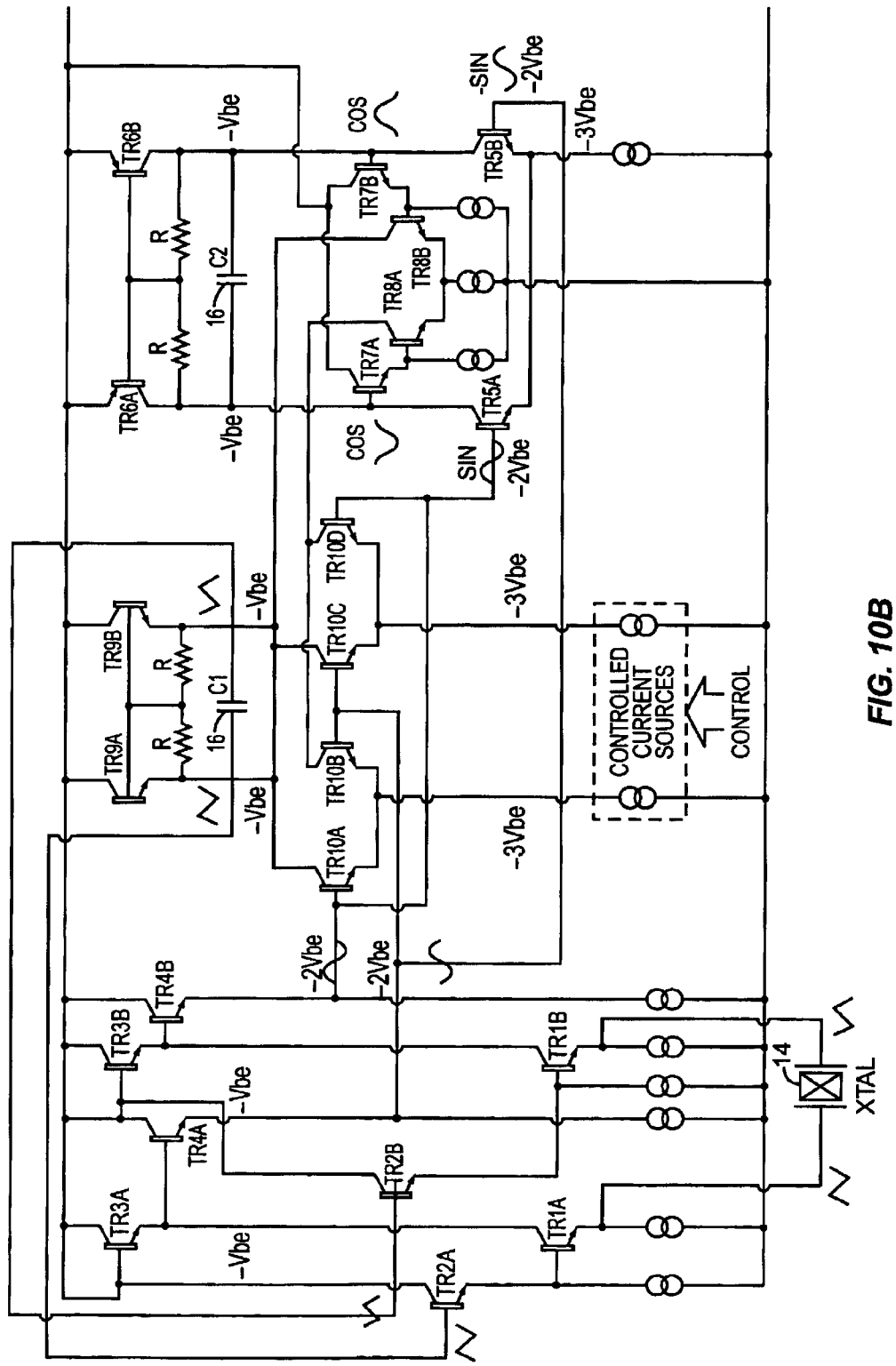
FIG. 10B is a circuit diagram of the circuit of FIG. 10A.

A transistor-level integrated circuit embodiment of the VXO of FIG. 10A is illustrated in FIG. 10B. A differential pair of transistors TR1A, TR1B driven by emitter followers TR2A, TR2B and with collector loads TR3A, TR3B forms a push-pull, or balanced, amplifier. The crystal 14 is connected between the emitters of TR1A and TR1B such that the differential pair has gain inversely proportional to the crystal impedance, and maximum gain occurs at crystal series resonance. The fully balanced circuit minimizes unwanted coupling with other circuit functions that may be integrated on to the same chip.

The output of the differential input stage is passed through emitter followers TR4A, TR4B to a Gilbert-cell balanced modulator TR10A, TR10B, TR10C, TR10D. The collector load for the balanced modulator is formed from TR9A, TR9B and has a high impedance 2R to the differential mode, and a low impedance $$\frac{R}{2 \cdot Beta}$$

to the common mode. The differential mode load impedance is sufficiently high that $C_1$ dominates and forms an integrator at the modulator output.

The same signal that is fed to the balanced modulator additionally feeds a second integrator TR6A, TR6B with $C_2$ as the integrating capacitor. The output of the second integrator is limited by differential limiter tr7a, tr7b, tr8a, tr8b and the resulting square-wave current of constant magnitude is fed to the first integrator $C_1$. The output of the first integrator $C_1$ is fed back to drive the differential input amplifier TR1A, TR1B. Thus there is a first feedback loop around the crystal comprising an integrated-limited-integrated signal, the two integrators having together a 180-degree phase shift that is turned to a zero loop phase shift by selecting the differential input connections appropriately. This loop alone will cause oscillation at the frequency where the crystal impedance is real.

The balanced modulator adds a non-limited contribution to the feedback signal in a second feedback loop which is only integrated once, by $C_1$, and is thus in quadrature with the doubly integrated and limited first feedback loop. Moreover, the quadrature feedback loop is not limited. The quadrature feedback contribution may be varied in magnitude from negative through zero to positive by controlling the current sources in its tail circuit to provide more current to one side or the other of the modulator, thereby causing the oscillation frequency to shift around the crystal series resonance point.

The circuit of FIGS. 10A, 10B has the advantage that limiting the in-phase feedback path and not limiting the quadrature feedback path makes the slope of the frequency control curve independent of the crystal 14 ESR. The completely balanced circuit is also advantageous for integration on a chip used in a sensitive radio transmitter-receiver such as a mobile terminal, while avoiding interference due to unwanted radiation or coupling of the crystal frequency to other circuits.

Figure 10C:
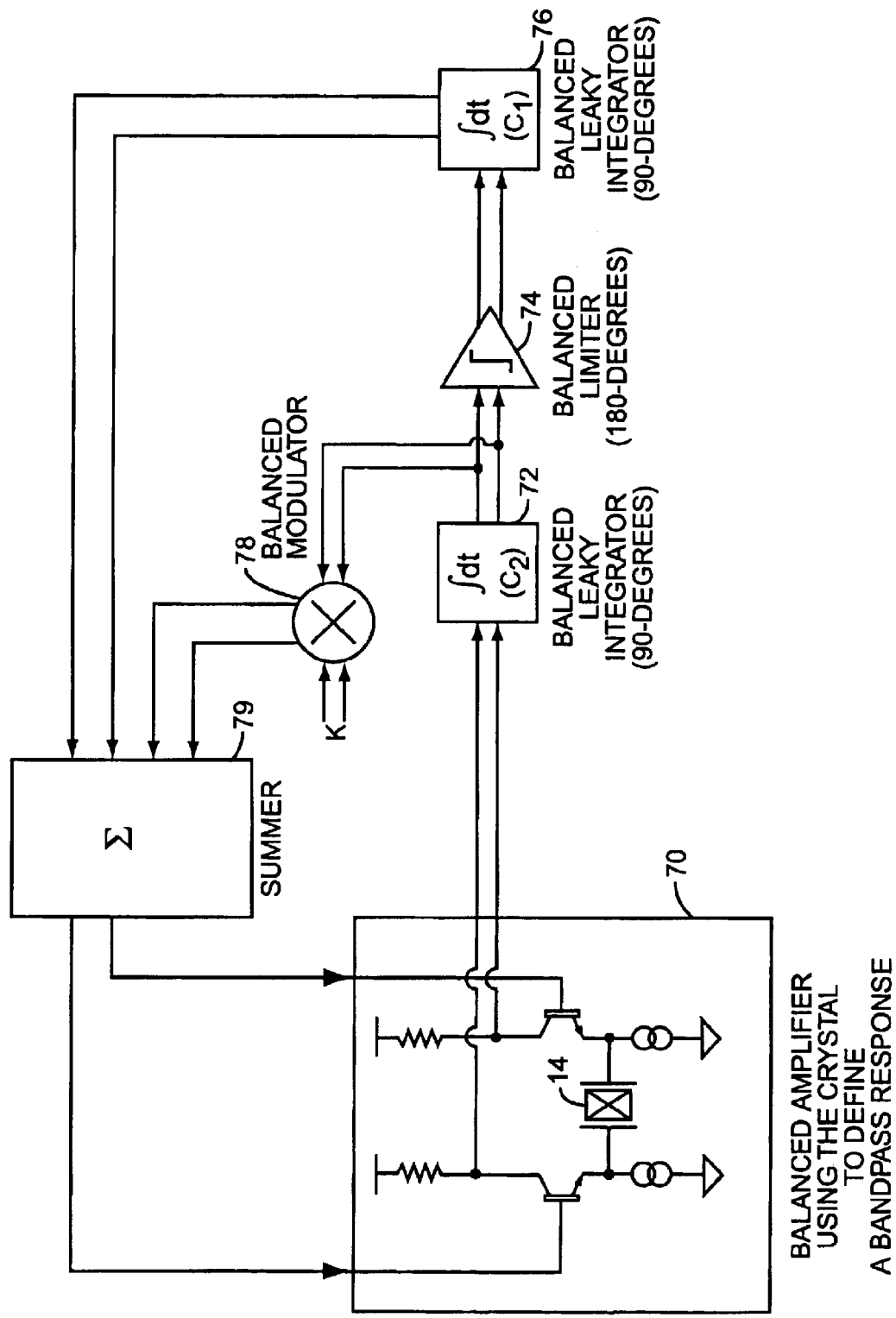
FIG. 10C is a block diagram of an alternate topology of the circuit of FIG. 10A.

Both results are additionally achieved in the circuit depicted in block diagram form in FIG. 10C. 10C depicts an alternate topology of the circuit of FIG. 10A, and like components are numbered correspondingly. FIG. 10C depicts the same two feedback loops: a limited loop with zero net phase shift formed by integrator 72, limiter 74, and integrator 76; and a non-limited loop with 90-degree phase shift formed by integrator 72, and including a modulator 78. The two loops are joined at summing junction 79 and feed back to balanced amplifier 70, which includes the crystal 14 in series resonance mode between the low impedance emitters of a push-pull transistor amplifier stage. Operation of the oscillator circuit of FIG. 10C is directly analogous to that described above relating to FIGS. 10A and 10B.

Figure 11:
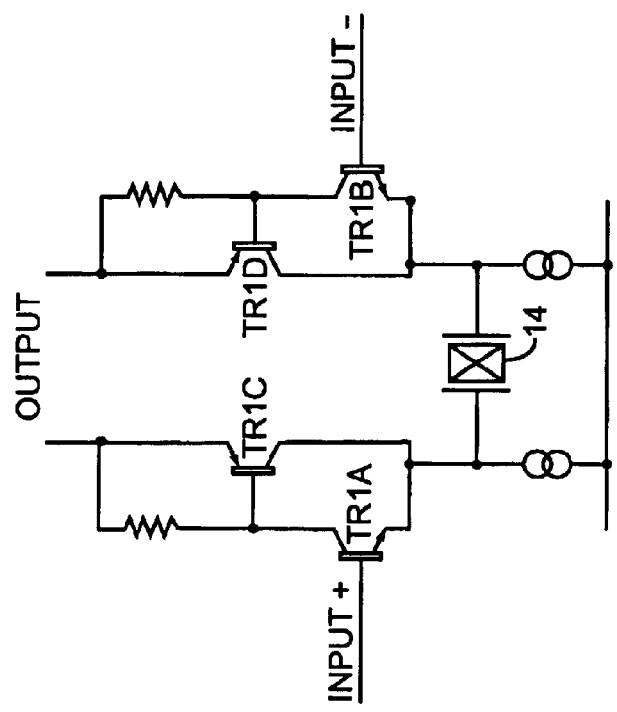
FIG. 11 is a compound transistor amplifier circuit.

Referring again to FIG. 10B, the gain of the differential input stage may be limited by the TR1A, TR1B emitter-to-emitter impedance of $50/I_e$, which can be higher than the crystal 14 ESR for small $I_e$. It is desirable to conserve current $I_e$ in battery-operated applications. Therefore either a higher impedance crystal having inductance in the 50 mH region and ESR in the 100 Ω region might be used, or else TR1A, TR1B can be replaced by a compound transistor amplifier. FIG. 11 depicts such a compound transistor amplifier, formed by TR1A, TR1C, and TR1B, TR1D. The emitter-to-emitter impedance of the compound transistor stage is reduced by the Beta of TR1C, TR1D to $$\frac{50}{Beta \cdot I_e}.$$

For Beta=50 and $I_e$=1 mA, this gives 1.0 Ω which is now small compared to the 8.7 Ω ESR of the exemplary crystal 14. The objective of operating the crystal at maximum Q is realized when substantially the only resistance in series with the crystal 14 is its own ESR. However, the control curve slope would, without the use of a limiter, then be dependent on the ill-defined ESR. The use of the limiter for the in-phase component of the loop feedback signal makes the control curve slope independent of the ESR.

Figure 12:
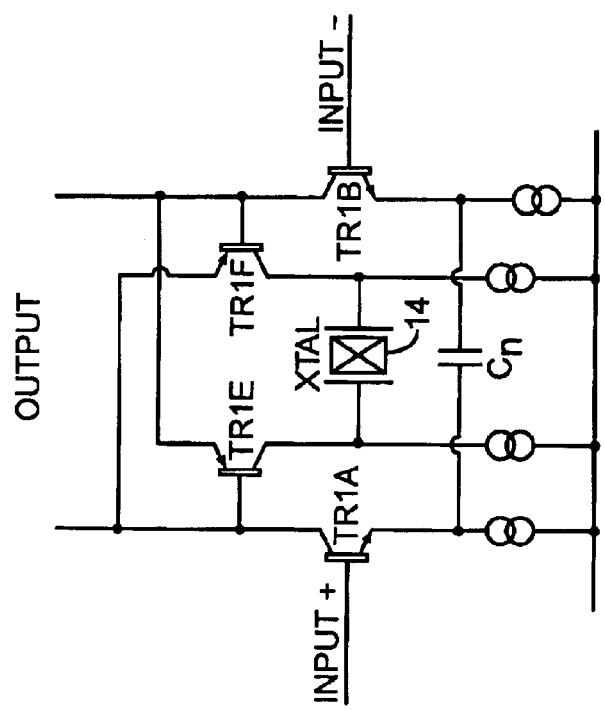
FIG. 12 is a circuit neutralizing the effect of $C_0$.

FIG. 12 depicts, according to one embodiment of the present invention, how the influence of the crystal shunt capacitance $C_0$ may be neutralized. A first differential input transistor pair TR1A, TR1B has the crystal 14 connected between its emitters. A second pair TR1E, TR1F has only a neutralizing capacitor $C_n$ connected between its emitters. The collectors of TR1E, TR1F are then cross-connected to the collectors of TR1A, TR1B so that the current due to the neutralizing capacitor $C_n$ adds in antiphase to the current due to the crystal $C_0$ and thereby cancels. In FIG. 12, TR1A, TR1B, TR1E, TR1F can all be compound transistors as depicted in FIG. 11.

Figure 13:
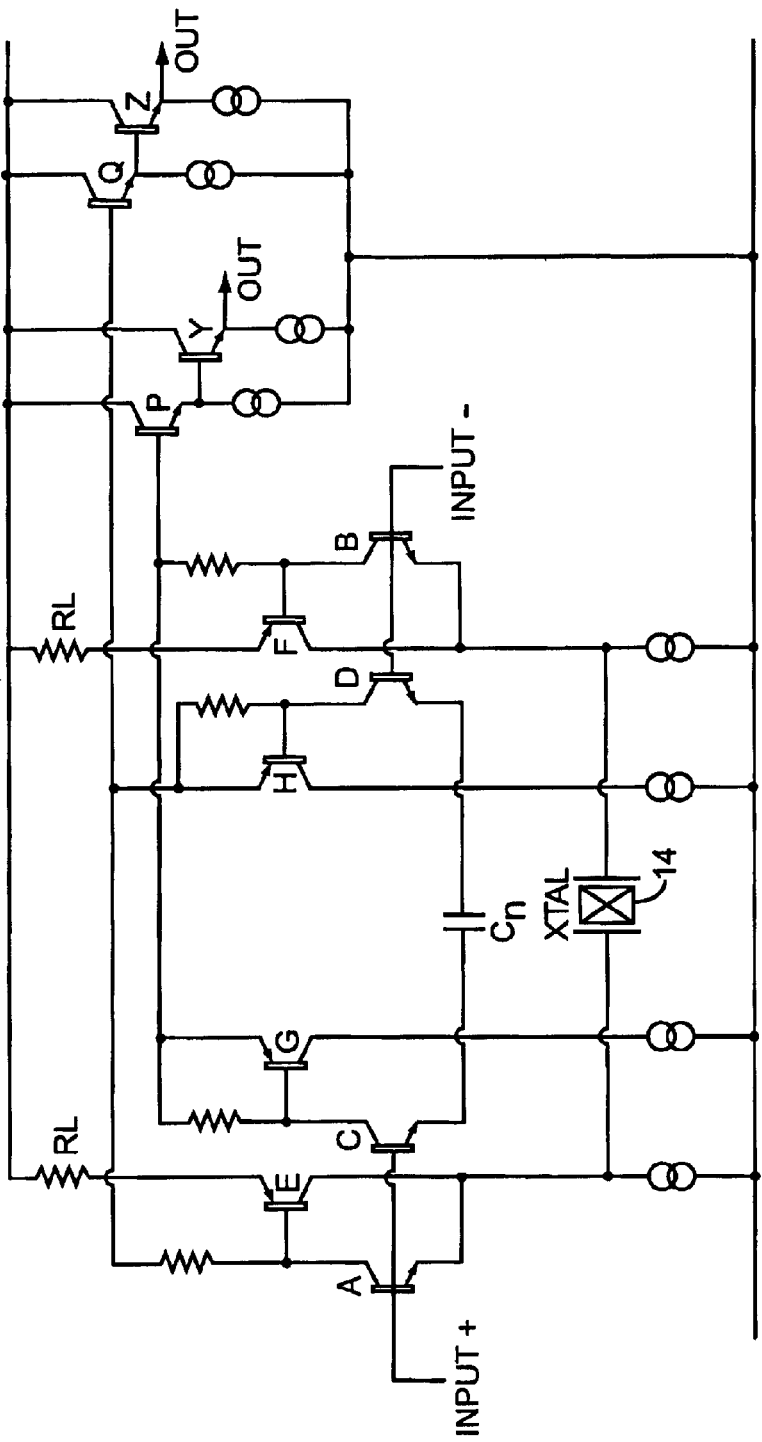
FIG. 13 is a circuit using a compound transistor amplifier and $C_0$ neutralization.

FIG. 13 depicts a complete differential input stage using compound transistors with neutralization of $C_0$. Transistors A, E form one compound input transistor of a first differential pair and B, F form the other side of the pair. The first differential pair has the crystal 14 connected between the emitters. A second differential pair is formed by the compound transistors C, G and D, H and has a neutralizing capacitor $C_n$ connected between its emitters. The compound transistor collectors for the first differential pair are the emitters of transistors E and F and the collectors of the second differential pair are the emitters of transistors G and H. The latter are connected to the former with a reversal so that current due to $C_n$ in the second differential pair adds in antiphase to the current in the first differential pair due to the crystal shunt capacitance Co. The combined collectors have collector loads RL. When the crystal ESR is as low as 8.7 Ω, an RL of 100 Ω gives a gain of 2×100/8.7=23. The total current through RL may be as low as 1 mA so that the DC voltage drop is only 100 mV. Double emitter followers P, Y and Q, Z drop the DC level of the output signal a further 2 Vbe to about the same level as the circuit of FIG. 10, and therefore can connect directly to the modulator and second integrator as shown previously.

The circuits of FIGS. 10 and 13 are designed to operate from a voltage as low as 2.7V, which allows operation from a single rechargeable Lithium cell.

In the circuit of FIGS. 10A, 10B, 10C, the output signal point is not expressly depicted. An output may be taken from a variety of points, and its selection is within the discretion of the system designer. In general, the following points are relevant to the selection of an output point:

(i) The output signal should be taken from a point in the circuit where the signal has been filtered by the frequency selective resonance of the crystal, and before any stage of the circuit that may degrade the signal to noise ratio.

(ii) The output signal should be taken through a buffer stage such that uncertainties in the load driven by the output signal change neither the loop gain nor the loop phase shift, in order to avoid "load pulling."

Those of skill in the art will readily realize that the oscillator circuit of the present invention may be formed using field effect transistors, e.g. CMOS FETs, and that compound transistors may also be formed using FETs to achieve low crystal drive impedance. Implementation in the so-called Bi-CMOS, process in which both bipolar junction transistors and CMOS FETs are available, is additionally within the scope of the present invention.

Figure 14:
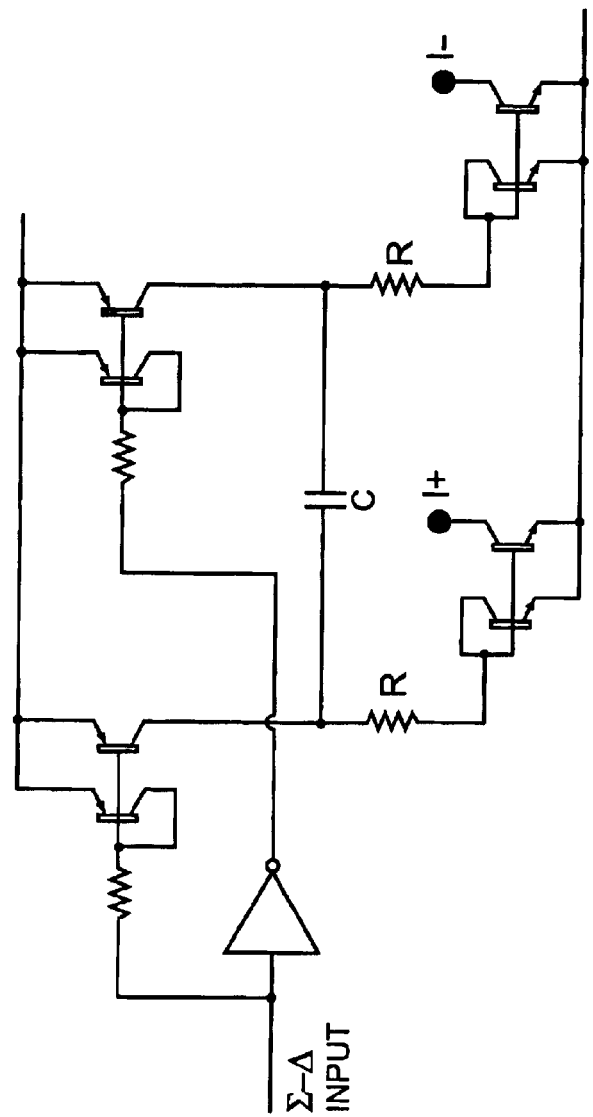
FIG. 14 is a circuit for controlling a balanced modulator with a $\Sigma\text{-}\Delta$ input.

Often, the tuning range of a VCXO need only be sufficient to adjust the crystal frequency to compensate for an initial cutting tolerance of ±10 ppm plus a temperature variation of ±10 ppm in order to form a Temperature Compensated Crystal Oscillator or TCXO. A control signal may be generated in response to a temperature sensor to provide open-loop frequency control in the absence of other frequency error information. When a frequency accurate signal is received, a frequency error relative to the received signal may be measured and the control signal altered to correct the measured error. In prior art mobile terminals, the control signal is generated as a digital signal by a signal processor and converted to an analog control signal by a DA converter for application to, e.g., a varactor diode. In the circuit of FIG. 10B, the control signal is applied to the current sources in the modulator tail circuit to vary the quadrature feedback or transreactance. The desired control range of ±20 ppm is only ±260 Hz for a 13 MHz oscillator, which is much smaller than the range of control plotted in the FIGS. 3, 4, 6, 7, 8 and 9. The control range may be diluted by reducing the amount of transreactance created by the balanced modulator, by scaling its tail currents and the gain distribution to provide the range of control desired. The current sources may be controlled using analog control voltages, preferably from a balanced Sigma-Delta D/A converter. The modulator can operate in "class B," as disclosed in pending U.S. patent application Ser. No. 09/602,385 by Applicant Dent and co-inventor Hadjichristos, which is hereby incorporated by reference in its entirety. Using the class-B modulator, both current sources are nominally at zero current when no transreactance is desired. When a positive transreactance is desired, the current in one current source is increased while the other remains nominally zero. When a negative transreactance is desired, the other current source is increased from zero while the former is held at zero current. The current sources can be formed by current mirrors so that their currents reflect control currents from the D/A converter, as described in the above-incorporated patent and depicted in FIG. 14. In FIG. 14, the input sigma-delta bitstream turns the P-type current mirrors alternately on and off. The P-type current is filtered by the filter R-C-R and the filtered current is mirrored by the N-type current mirrors to provide differential controlled currents I+ and I−.

Alternatively, the controlled current sources can comprise D/A conversion, accepting a set of digital control bits that turn on or off a series of paralleled current sources with relative scalings of 1:½:¼:⅛. . . In this case, steps to maintain monotonicity of the control curve may be needed if more than 256 steps of current are desired, for example by the use of a coarse and a fine current D/A in parallel, each driven by a separate control byte.

The design of VCXO/TCXO circuits using the techniques disclosed above enables accurate and stable variable-frequency crystal oscillators to be constructed on an integrated circuit with the minimum number of external components, thereby reducing the cost and size of consumer products such as mobile terminals.

Although the present invention has been described herein with respect to particular features, aspects and embodiments thereof, it will be apparent that numerous variations, modifications, and other embodiments are possible within the broad scope of the present invention, and accordingly, all variations, modifications and embodiments are to be regarded as being within the scope of the invention. The present embodiments are therefore to be construed in all aspects as illustrative and not restrictive and all changes coming within the meaning and equivalency range of the appended claims are intended to be embraced therein.

What is claimed is:

1. A variable frequency oscillator circuit, comprising:
  a resonant component;
  a sustaining amplifier connected to said resonant component and generating an output signal,
  a first feedback loop connected to said sustaining amplifier for an in-phase component of said output signal, said first feedback loop including a limiter having an output amplitude signal that is substantially independent of its input amplitude signal; and
  a second feedback loop connected to said sustaining amplifier for a quadrature signal component of said output signal bypassing said limiter,
  wherein the output frequency of said oscillator circuit is varied by altering said quadrature signal component.

2. The oscillator circuit of claim 1 wherein the total loop phase shift is zero, modulo 2π.

3. The oscillator circuit of claim 2 wherein said first feedback loop includes two components introducing a 90-degree phase shift and one component introducing a 180-degree phase shift, and said second feedback loop includes one component introducing a 90-degree phase shift.

4. The oscillator circuit of claim 3 wherein said components introducing a 90-degree phase shift comprise integrators.

5. The oscillator circuit of claim 3 wherein said components introducing a 90-degree phase shift comprise differentiators.

6. The oscillator circuit of claim 3 wherein said component introducing a 180-degree phase shift comprises said limiter.

7. The oscillator circuit of claim 1, further comprising a modulator operative to alter said quadrature signal component in response to a control input, to control the output frequency of said oscillator circuit.

8. The oscillator circuit of claim 7 wherein the gain of said circuit remains constant as said quadrature signal is altered.

9. The oscillator circuit of claim 7 wherein said resonant component exhibits an equivalent series resistance and wherein the relationship between a change in said control input and a corresponding change in said output frequency is substantially independent of said equivalent series resistance.

10. The oscillator circuit of claim 1 wherein said sustaining amplifier is balanced, and said output signal comprises a differential pair.

11. The oscillator circuit of claim 1 wherein said resonant component is a piezo-electric device.

12. The oscillator circuit of claim 11 wherein said piezo-electric device is a quartz crystal.

13. The oscillator circuit of claim 1 wherein said resonant component exhibits a nominal resonant frequency and wherein said nominal resonant frequency is a series-resonant frequency at which said resonant component exhibits a minimum impedance.

14. The oscillator circuit of claim 1 wherein said resonant component exhibits a series resonant frequency and wherein said output frequency is varied around said series resonant frequency.

15. The oscillator circuit of claim 1 further comprising a circuit for neutralizing the influence of a shunt self-capacitance of said resonant component.

16. The oscillator circuit of claim 1 wherein the phase shift of said second feedback loop differs from the phase shift of said first feedback loop by ±90 degrees.

17. The oscillator circuit of claim 1 wherein said sustaining amplifier is balanced, and said first and second feedback loops comprise differential pair paths through balanced components.

18. The oscillator circuit of claim 1 wherein one of said first or second feedback loop includes an odd number of integrators or differentiators and the other of said first or second feedback loop includes an even number of integrators or differentiators.

19. The oscillator circuit of claim 1 wherein said first and second feedback loops each exhibit a gain, and wherein the gains of said first and second feedback loops relative to each other are controlled to produce a controllable phase shift while maintaining a constant loop gain.

20. The oscillator circuit of claim 19 further including a modulator in said first or said second feedback loop, but not both, to control said relative gain.

21. The oscillator circuit of claim 20 wherein said relative gain varies from a negative value through zero to a positive value.

22. The oscillator circuit of claim 20 wherein the phase of the gain of the feedback loop including said modulator contributes a quadrature component to the feedback loop gain having a phase shift equal to ±90 degrees.

23. A variable frequency oscillator circuit, comprising:
  a balanced, sustaining amplifier having differential inputs and outputs;
  a crystal oscillator connected across said balanced, sustaining amplifier; and
  a feedback loop comprising
    a first balanced phase shift component having a differential input connected to said balanced, sustaining amplifier differential output, and a differential output;
    a balanced phase shifter having a differential input connected to said first balanced phase shift component differential output, a control input operative to alter the amount of phase shift, and a differential output;
    a balanced limiter having a differential input connected to said balanced phase shifter differential output, and a differential output whose signal amplitude is substantially independent of the signal amplitude of its differential input; and
    a second balanced phase shift component having a differential input connected to said balanced limiter differential output, and a differential output connected to said balanced, sustaining amplifier differential input; and a control signal connected to said balanced phase shifter control input, whereby the output frequency of said variable frequency oscillator circuit varies in response to said control signal.

24. The oscillator circuit of claim 23 wherein said crystal oscillator operates in series resonant mode.

25. The oscillator circuit of claim 23 wherein said crystal oscillator exhibits a series resonant frequency, and wherein said output frequency is varied around said series resonant frequency.

26. The oscillator circuit of claim 23 wherein the loop phase shift of said oscillator circuit is zero, modulo 360 degrees.

27. The oscillator circuit of claim 23 wherein said first and second balanced phase shift components each impart a 90-degree phase shift, and a balanced integrator imparts a 180-degree phase shift.

28. The oscillator circuit of claim 27 wherein said first and second balanced phase shift components comprise balanced leaky integrators.

29. The oscillator circuit of claim 27 wherein said first and second balanced phase shift components comprise balanced differentiators.

30. The oscillator circuit of claim 23 wherein said balanced phase shifter comprises a balanced quadrature modulator.

31. The oscillator circuit of claim 23 wherein said balanced limiter is operative to maintain the amplitude of the feedback signal constant, while passing the varying phase generated by said balanced phase shifter.

32. The oscillator circuit of claim 23 wherein said feedback loop exhibits a loop gain, and wherein said loop gain is constant.

33. A variable frequency oscillator circuit having shunt capacitance neutralization, comprising:

a balanced amplifier having differential inputs and outputs, comprising a first pair of transistors, each transistor having a gate, a collector, and an emitter, said differential inputs connected to the gates of said transistors and said differential outputs comprising the collectors of said transistors;

a crystal oscillator having a shunt capacitance connected between the emitters of said balanced amplifier transistors;

a second pair of transistors, each transistor having a gate, a collector, and an emitter, the collectors of said second pair of transistors cross-connected to the collectors of said first pair of transistors; and a neutralizing capacitor connected between the emitters of said second pair of transistors, whereby current flow through said first pair of transistors due to the shunt capacitance of said crystal oscillator is cancelled by current flow through said second pair of transistors due to said neutralizing capacitor.

* * * * *